United States Patent [19]

Beaudet

[11] Patent Number: 4,709,381
[45] Date of Patent: Nov. 24, 1987

[54] CCD FOCAL PLANE ARRAY CONVOLVER

[75] Inventor: Paul R. Beaudet, Upper Marlboro, Md.

[73] Assignee: Westinghouse Electric Corp., Pittsburgh, Pa.

[21] Appl. No.: 841,396

[22] Filed: Mar. 19, 1986

[51] Int. Cl.$^4$ .................. G11C 19/28; H01L 29/78; H01L 27/14; G06G 7/12

[52] U.S. Cl. .......................................... 377/62; 357/24; 357/30; 333/165; 364/819; 364/862

[58] Field of Search .............. 357/24, 30; 377/57–63; 333/165; 364/819, 820, 826, 862

[56] References Cited

U.S. PATENT DOCUMENTS

| | | | |
|---|---|---|---|
| 3,942,163 | 3/1976 | Goyal | 357/24 |
| 4,245,233 | 1/1981 | Lohstroh | 377/60 |
| 4,555,770 | 11/1985 | Sage | 333/165 |
| 4,574,295 | 3/1986 | Tanikawa et al. | 357/24 |

Primary Examiner—Gene M. Munson
Attorney, Agent, or Firm—W. G. Sutcliff

[57] ABSTRACT

A semiconductor CCD focal plane array convolver is taught which permits performing convolution functions on the focal plane array chip. An X-Y array of photosensitive pixels is disposed in a semiconductive substrate, with a CCD roadway comprising a pattern of rows and columns of conductive gates upon the substrate surrounding and defining the X-Y array of pixels. The number of gates for each pixel are selected to permit charge from the pixel to be collected in either a first charge holding packet for a positive convolution coefficient, or in a second paired charge holding packet for a negative convolution coefficient. The convolution function is performed by applying gate signals which move the charge packets around the CCD roadway. A differencing electrometer is provided at the periphery of the CCD roadway to permit differencing the accumulated charge stored in the paired charge holding packets to difference the positive and negative convolution coefficients to provide a convolution output signal.

4 Claims, 9 Drawing Figures

CCD FOCAL PLANE ARRAY CONVOLVER

BACKGROUND OF THE INVENTION

The present invention relates to imaging technology, and more particularly to CCD imaging and signal processing. Such CCD devices have been proposed for pattern recognition and the interpretation of the imaged pattern for both robotic vision systems as well as surveillance applications.

In such CCD imaging devices, either a linear array or two-dimensional X-Y array of photosensitive picture elements or pixels are utilized to produce an electronic charge pattern which is related to the imaged scene. The CCD device facilitates collection and processing of the electronic output signal. These devices are not practical for applications such as robotic vision because of the large number of pixels that must be processed to reduce the vast quantity of data to signals that can be used for the control of robotic movements or other decision making. Such limitations apply in general to systems which require real time or at least near real time signal processing.

In U.S. Pat. No. 4,331,889 a CCD focal plane array is described with signal enhancement had by increasing the integration time during which each detector generates a photo current. U.S. Pat. No. 4,275,315 teaches an optically scanned monolithic focal plane array with an on-chip aperture corrector which sums charge using a main CCD and a secondary CCD, with a summing node between them.

U.S. Pat. No. 4,187,000 teaches an optical computer for computing a variety of functions, including convolution in real time. This prior art patent offers a general theoretical description of convolver computation and function. U.S. Pat. No. 4,200,861 teaches a pattern recognition device with stored information compared in real time with field-of-view information, and convolved to generate a correlation number indicating the percentage of match.

U.S. Pat. No. 4,298,887 teaches a multi-element starring infrared imaging system with non-uniformity correction had using a convolution integral to correct for non-uniform pixel element response. U.S. Pat. No. 4,301,471 describes a moving target indicator system using CCD signal processing. The processing of signals from CCD's is described in U.S. Pat. No. Re. 30,087; U.S. Pat. Nos. 4,035,629; and 4,079,238, and these signal processing techniques referred to as correlated double sampling, and extended correlated double sampling are incorporated herein by reference and are usable with the present invention.

In order to simplify and speed up the processing and interpretation of optical image signals, techniques have been developed in the prior art for processing the image data to extract the location of expected object features. Special preprocessing hardware has been used to convert the grey level imagery to a black and white binary image. The technique of thresholding has been used so that objects of interest become silhouettes on a bright background, and elementary edge extraction provides the silhouette of object edges on a dark background. In real world environments, such binary imaging is not adequate for reliable classification and interpretation of the scene and multi-feature grey level image data is desired.

In pattern recognition for robotics and other applications, image data (pixel values) must be processed to extract only a few values useful to direct the mechanical motion of the robot, or to describe the viewed environment. In image interpretation algorithms, primitive image operations include the performing of linear convolutions, and the combination of these convolutions in nonlinear ways for extracting rotational invariant features, such as edges, lines, corners, line-ends, points, texture, curved edges, etc. Vectors of these rotationally invariant features are used to classify regions for the image, and to extract the reduced data set required for directing the robot activities or for interpreting the viewed scene.

The major computational bottleneck in such image interpretation is in the convolution operation required to extract rotationally invariant features. A typical convolution might involve the multiplication and addition of a $7 \times 7$ array of coefficients by image data, centered at all possible pixel locations. In some microprocessors, a a multiplication requires about 250 microseconds. If five separate convolutions are extracted over a $256 \times 256$ pixel image region, the processing would take over an hour. It is, therefore, necessary that the convolution be performed more rapidly in the order of milliseconds or microseconds on the focal plane of the imaging CCD.

In many vision system applications, linear convolution image operators are required for extracting signatures needed in recognizing patterns. A convolution in a linear combination of neighboring pixel values centered about some point on the focal plane at a given time. The neighboring pixels can be separated either by space or in time. The linear combination is expressed as:

$$C_{ij}(t) = \sum_{l,m;k} a_{l,m;k} I_{i+l,j+m}^{(t+k)}$$

where i, j are the coordinates of the centering point on the focal plane at some time, t.

In order to accommodate both positive and negative convolution coefficients. $a_{lm;k}$, the focal plane convolver of the present invention performs two separate convolutions by associating all of the terms of like signs together.

$$C_{i,j}(t) = C_{i,j}^{(+)}(t) - C_{i,j}^{(-)}(t)$$

Both $C^{(+)}$ and $C^{(-)}$ have positive coefficients and can be physically realized by collecting photo-generated electrons from appropriate pixel sites with integration time proportional to the magnitude of the convolution coefficient.

The CCD focal plane convolver of the present invention collects these electrons in two paired charge packets corresponding to $C^{(+)}$ and $C^{(-)}$ centered about every pixel (i,j) and performs the difference, $C^{(+)} - C^{(-)}$ on the chip in a noise compensating manner using the double correlated double sampling processing described in the aforementioned U.S. Pat. No. Re. 30,887; U.S. Pat. Nos. 4,035,629; and 4,079,238.

Some aspects and applications of the present invention are described in "CCD Focal Plane Convolver (Smart Eyeball)", by Dr. Paul R. Beaudet, published Mar. 20, 1985 in *Machine Vision Technical Digest*, and the teachings of this paper are incorporated by reference herein.

SUMMARY OF THE INVENTION

A semiconductor CCD focal plane array convolver is described which is a two-dimensional array with a CCD roadway which permits performing the convolution function to be performed on the focal plane array. The CCD focal plane array convolver comprises an X,Y array of photosensitive pixels disposed in a semiconductive substrate, with a CCD roadway comprising a pattern of rows and columns of conductive gates disposed on the substrate. The rows and columns of gates surround and define the X,Y array of pixels. The number of gages is selected to permit charge to be collected from an individual pixel in a first charge holding packet defined for a positive convolution coefficient, and in a paired second charge holding packet for a negative convolution coefficient.

The on-chip convolver includes means for applying clocked signals to the CCD gates associated with respective pixels to permit charge to be injected from respective pixels into the respective paired first and second charge holding packets. The accumulated charge in any charge holding packet is determined by the injection period and the image generated photo charge at the respective pixel. Clock signals are applied to the CCD gates for moving the charge holding packets along the CCD roadway to accumulate charge from a predetermined subarray of neighboring pixels to implement a predetermined linear convolution. Clock signals are also applied to the CCD gates for moving the charge stored in paired charge holding packets accumulated from already processed convolutions along the CCD roadway to the periphery of the CCD roadway. Means are provided on the semiconductive substrate at the CCD roadway periphery for differencing the accumulated charge stored in paired charge holding packets to difference the positive and negative convolution coefficients to provide a convolution output signal.

In the preferred embodiments, four CCD gates in the roadway are used to hold one charge packet, with enough gates unique to the pixel for five charge packets, or 20 gates. The roadway is shielded from light so that the accumulated charge is not modified by photo-conversion. The "city blocks" are the active pixel areas. There, photons cause electrons to jump from the semiconductor valence band to the conduction band. Once in the CCD roadway, they move from gate to gate through the application of external potentials. There is enough roadway roadway real estate to hold five charge packets for each pixel site. One of these packets is empty so that the columns can operate independently from the rows. Two of the charge holding packets (along the rows) are actively collecting charge from neighboring pixel sites in creating the convolutions $C^{(+)}$ and $C^{(-)}$, while the two column packets contain already processed convolutions which are simultaneously being read out and differenced at the bottom of the array using the double correlated double sampling technique.

The CCD roadway structure used in the present invention permits the transfer of charge from any individual pixel in any of four independent directions. This is accomplished by forming two Y junctions of gates at each roadway intersection.

The CCD focal plane array convolver of the present inventions can be implemented with an X-Y array of, for example, 120×120 or 256×256, and operated at varying computational rates.

DESCRIPTION OF PREFERRED EMBODIMENT

Figure 1:
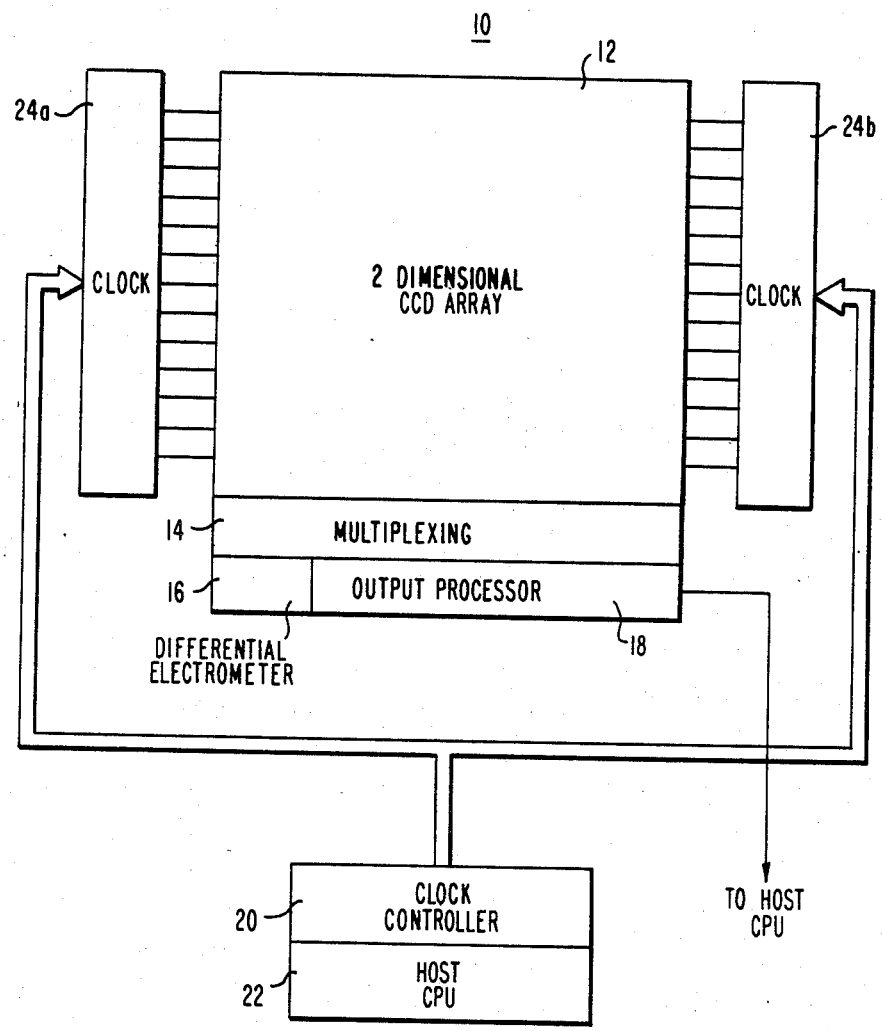
FIG. 1 is a schematic representation of the two-dimensional CCD focal plane array convolver of the present invention.

The invention can be best understood by reference to the embodiment shown in the drawings, and in FIG. 1 the semiconductor CCD focal plane array convolver 10 is seen in schematic fashion. The convolver 10 includes on a common semiconductive substrate a two-dimensional X-Y focal plane CCD array 12, a peripheral multiplexing means 14 and a pre-amp/buffer electrometer 16. An output processor 18 which functions as a serial differential amplifier is also illustrated in this embodiment for processing the convolution output signal prior to feeding it to a host CPU. The multiplexed output from means 14 is fed to the electrometer 16 which functions as a pre-amp/buffer to the serial differential amplifier signal processor means 18. This means 18 may be disposed on a common substrate with the array 12 and means 14 and 16, or electrically connected as a separate off-substrate component. The signal processor means 18 cooperates with and controls operation of the electrometer 16 to produce an output voltage signal proportional to the difference between the charge packets fed sequentially from the array. This signal processor means 18 is more fully described as a double-correlated double-sampling signal processor in the aforementioned U.S. Pat. Re. 30,087, U.S. Pat. Nos. 4,035,629, 4,079,238.

A clock controller 20 is connected to the host CPU 22 and to clock input means 24a, 24b which are connected to opposed peripheral edges of the CCD array 12. The host CPU 22 is programmed to drive the clock controller to provide the appropriate clock signal and timing per FIGS. 5A–5F through FIGS. 9A–9E to perform the desired convolution on the convolver 10 as will be explained hereafter.

Figure 2:
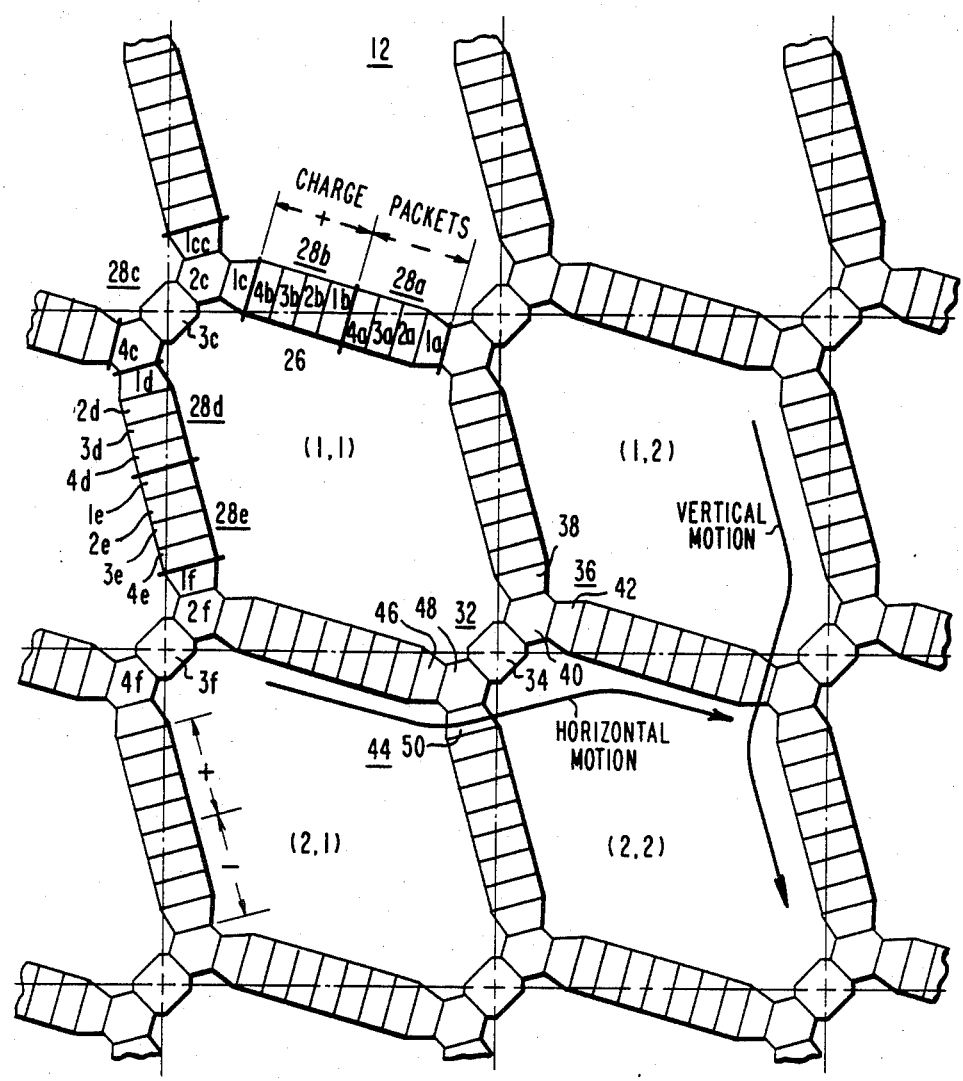
FIG. 2 is a schematic representation of a portion of the CCD focal plane array which illustrates the roadway structure.

FIG. 2 is a schematic representation of a portion of the CCD array 12, with four photosensitive pixels (1,1), (1,2), (2,2), and (2,1) shown defined by a CCD roadway 26 which surrounds and defines the pixels. The CCD roadway 26 is shielded from incoming photo-radiation from the viewed scene which is being imaged and interpreted. The photo-radiation generates charge in an individual pixel as a function of the scene. The CCD roadway 26 provides a pathway for charge movement in both the horizontal and vertical directions.

In the embodiment seen in FIG. 2, for each pixel there are five charge holding packets 28a, 28b, 28c, 28d, and 28e, each having four gates unique to each pixel with the empty charge holding packet 28c having five gates. Thus, for pixel (1,1) starting at the upper right corner, gates 1a-4a comprise a first charge holding packet 28a, here designated as negative, with gates 1b-4b comprising a second paired charge holding packet 28b, shown here as positive, gates 1c, 1cc, 2c, 3c, and 4c comprise the third empty charge holding packet 28c, gates 1d-4d comprising a fourth charge holding packet 28d, and gates 1e-4e comprising a fifth charge holding packet 28e. The function of the empty charge packet at the roadway intersection is to run the columns independently of the rows using the four-phase scheme as shown. The other two charge holding packets are paired positive and negative packets.

The positive and negative labeled charge holding packets each are made up of 4 gates, while the empty charge holding packet 28c is made up of 5 gates, i.e., 1c, 2c, 3c, 4c and gate 1cc which corresponds to the first phase for the column and gate 1c which is the first phase for the row. Each pixel therefore has 21 gates uniquely associated with it to define the five charge packets. While the five charge packets are needed for handling the charge around the roadway, the number of gates which make up a charge packet can be reduced by using virtual phase CCD techniques rather than the four-phase technique described herein. However, such a virtual phase CCD device would be limited to convolutions of limited symmetrical neighborhood subarrays.

Figure 3:
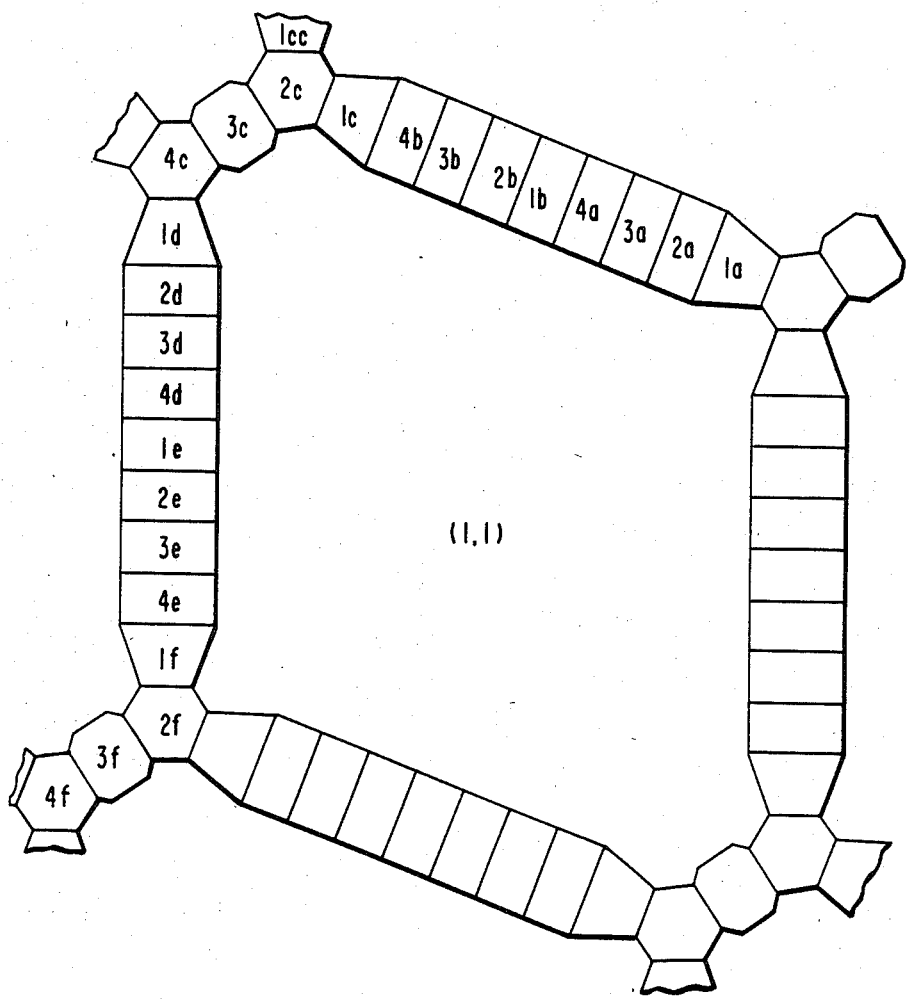
FIG. 3 is an enlarged diagrammatic representation of a single pixel defined by the surrounding CCD roadway.
Figure 4:
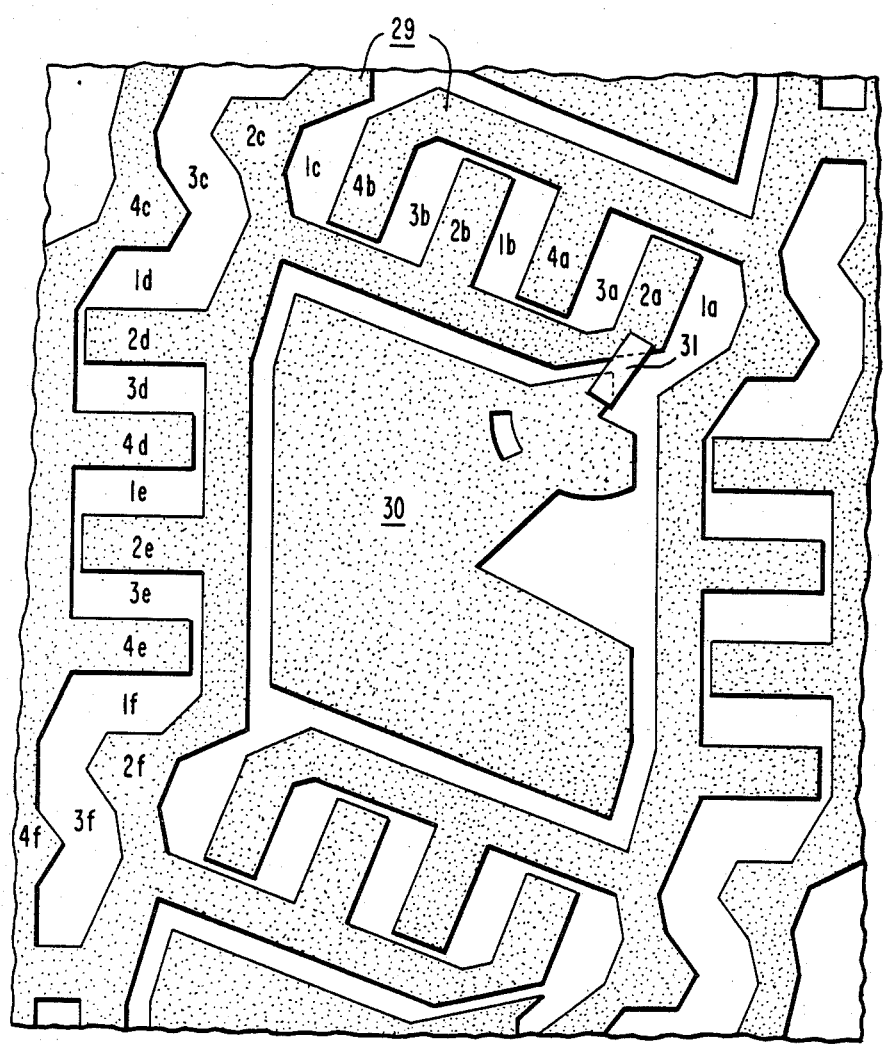
FIG. 4 is an enlarged representative of the first level gate pattern for a single pixel and matches the FIG. 3 representation to illustrate how the gates define the roadway.

FIG. 3 illustrates in enlarged fashion the single pixel (1,1) and the CCD roadway 26 about it with the gates labeled as per FIG. 2. FIG. 4 illustrates the first level conductive gate pattern deposited on the semiconductive substrate which is used in part to define the gates as seen in FIG. 3 which can be overlaid over FIG. 4 and aligned therewith with the gate areas seen in FIG. 4 and a second level gate pattern not shown, but which is interleaved with the pattern of FIG. 4 to provide the CCD roadway seen in FIG. 3. In FIG. 4, the white areas are the first level conductive gate material 29 and the resistive gate 30 of the CCD pixel sensor. Phases 2 and 4 of the CCD are clocked everywhere the same, while phases 1 and 3 have common connections only in the columns. The rows are independently gated from the columns so that horizontal and vertical migration of charge packets are independent.

The resistive gate 30 of the CCD sensor provides a focusing field for photo-charge to be transported to the upper right of the sensor. It also provides a pixel processing capability that permits a fraction of the charge to be split from the rest and injected into the CCD in such a way as to provide a signal having nearly constant noise variance. The photon shot noise associated with high intensity signals is thereby neutralized so that the convolution can be processed in the equal variance space to avoid the deterimental effects in pattern recognition caused by shot noise in high intensity signals.

Figure 5:
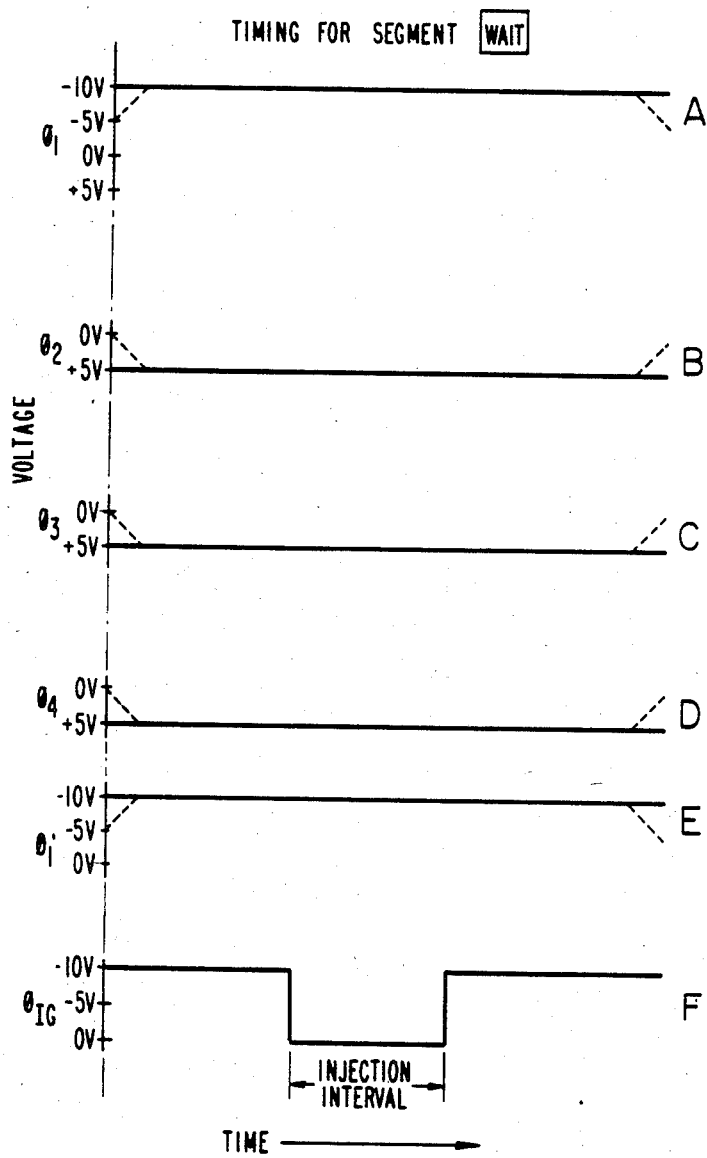
FIGS. 5A–5F illustrate the clock signals and timing of the signals applied to gates of the CCD which control the charge packets, in the roadway, and this Figure is for maintaining the charge packets stationary or in a wait mode as for filling charge from a pixel into either the positive or negative charge packet with FIG. 5F illustrating the injection gate potential applied to transfer charge from the sensor to the CCD roadway.
Figure 9:
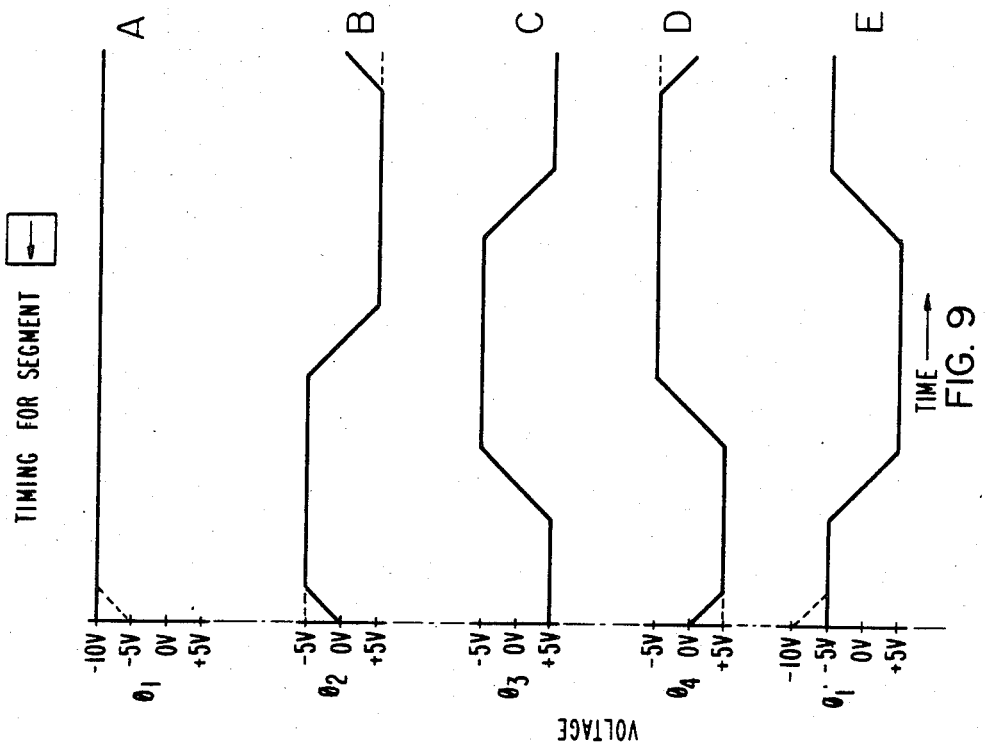
FIGS. 9A–9E illustrate the clock signals and timing for moving charge packets in a to-the-left sideway direction along a roadway row.
Figure 6:
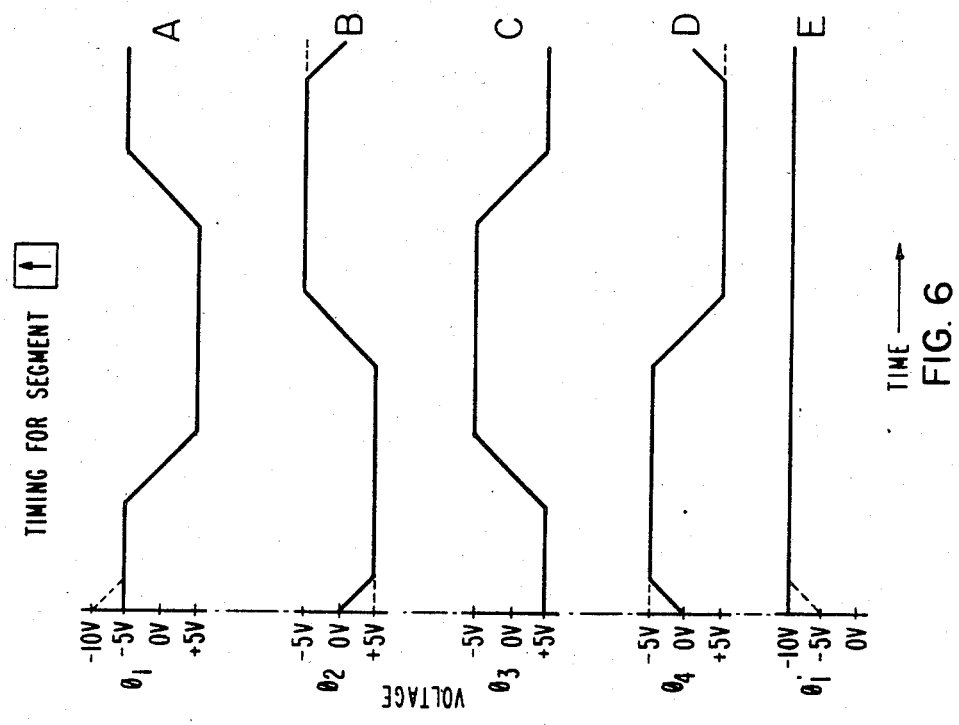
FIGS. 6A–6E illustrate the clock signals and timing for moving charge packets in a vertical upward direction along a roadway column.
Figure 8:
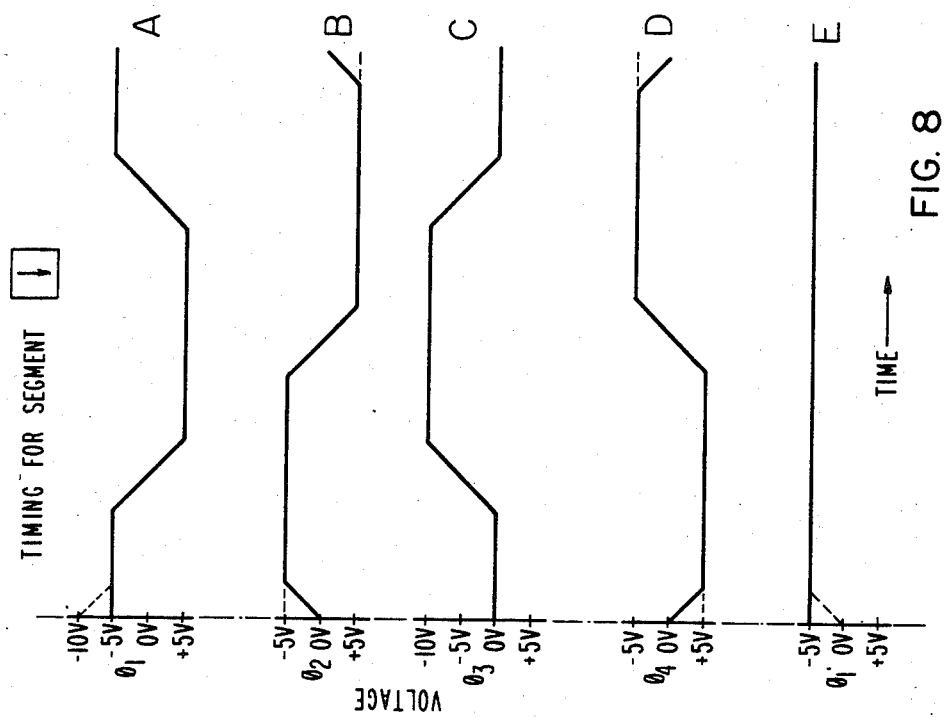
FIGS. 8A–8E illustrate the clock signals and timing for moving charge packets in the vertical downward direction along a roadway column.
Figure 7:
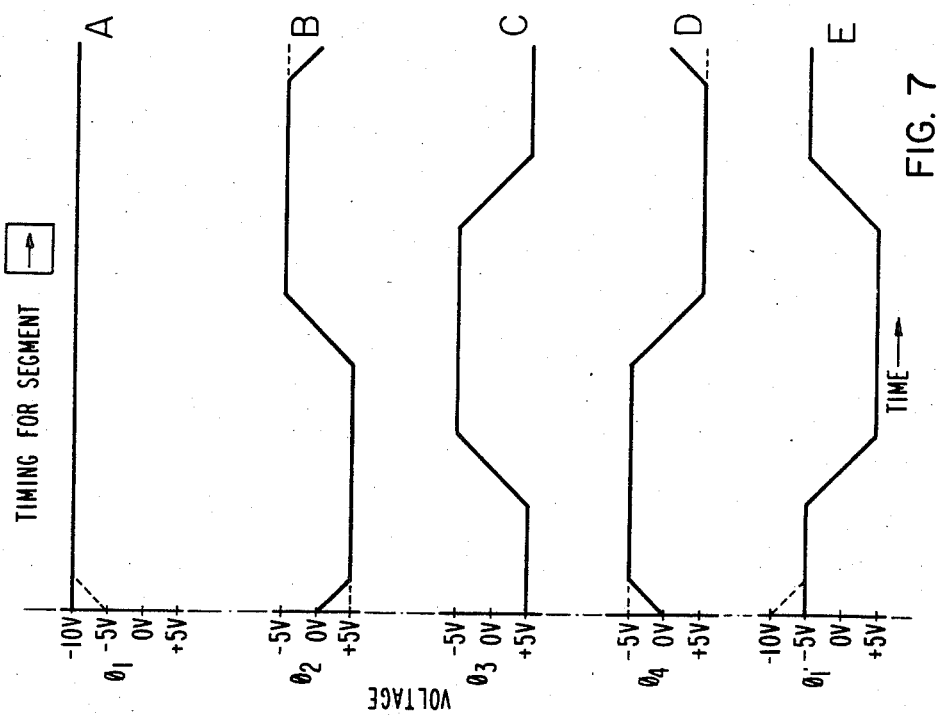
FIGS. 7A–7E illustrate the clock signals and timing for moving charge packets in a to-the-right sideway direction along a roadway row.

An injection gate 31 is disposed insulated above the resistive gate 30 of the sensor and extends in part over CCD gate 2a which serves as an injection port for the CCD roadway. The charge from the sensor can thus be transferred from the sensor by applying potential $\phi_{IG}$ as shown in FIG. 5F to the injection gate 31, while the CCD gates are in the wait mode per FIGS. 5A-5E with $\phi_2$ applied to gate 2a per FIG. 5B. In order to maintain the charge in the desired pathway, i.e., the sensor and CCD roadway, a lateral charge flow barrier is also disposed son or in the substrate about the resistive gate 30 and the CCD roadway 26. This lateral charge barrier is not shown in the drawings but can be an ion implanted region in the substrate or a separate conductive pattern on the substrate.

The CCD roadway 26 described with respect to FIG. 2 solves the problem of being able to transfer charge from pixel to pixel at roadway intersections in any one of four indpendent directions. Thus, in FIG. 2 looking at the roadway intersection 32 at the lower right hand corner of pixel (1,1) two Y junctions are formed, with gate 34 coupling the upper Y junction 36 formed by gates 38, 40, 42, to lower Y junction 44 formed by gates 46, 48, 50. Each of the roadway intersections of the array is identical in this respect with two Y junctions being coupled together using a coupling gate between the Y junctions with one arm of the Y being part of a column, and the other arm of the Y being part of a row.

The operation of the CCD focal plane array convolver 10 can be appreciated by reference to the clock signals and timing seen in FIGS. 5A-5E, 6A-6E, 7A-7E, 8A-8E, and 9A-9E. The gates of the CCD can be configured into a five phase structure which permits charge packets to move in horizontal or vertical direction. Phases 2, 3, and 4 are, for example, applied to gates 2a-4a of charge packet 28a, and to gates 2b-4b of charge packets 28b, and these are two level gates which are $\pm 5$ volts. The gates 1a and 1b as well as gates 1d and 1e are three level gates, e.g. ($\pm 5$ volts-10 volts). The CCD channel is assumed to be N-type for the discussion, but the discussion also applies to P-type channels simply by reversing the "sign" of the gate potentials and replacing the N-channel with a P-channel. When electrons are the active carriers, a negative potential on the gate (relative to the substrate) will be repulsive, while more positive gate potentials will attract the electrons. In FIGS. 5A-5E through 9A-9E, the gate potential for all five phases are shown with negative values increasing along the y-axis because a "lower-more positive" signal will attract electrons. This convention makes the figures more appealing in keeping with our gravitational intuition.

FIGS. 5A-5E show the gate phases, signal levels and timing needed to "wait" or maintain a charge holding packet in a given position along the roadway.

FIG. 5F shows the potential which is applied to the injection gate to move charge from the sensor the CCD roadway.

FIGS. 6A-6E illustrate how to move a charge packet vertically upward along the roadway.

FIGS. 6A-6E illustrate how to move a charge packet vertically upward along the roadway.

FIGS. 7A-7E illustrate how to move a charge packet horizontally sideways to the rights.

FIGS. 8A-8E illustrate how to move a charge packet vertically downward along the roadway.

FIGS. 9A-9E illustrate how to move a charge packet horizontally sideways to the left.

In moving charge down the column per FIGS. 8A-8E, phase $\phi_1'$ is held in a highly repulsive state and applied to gates 1a, 1b, and 1c, thereby isolating the positive and negative charge packets contained in the rows. With phase $\phi_1'$ held repulsive, the normal gating of the phases $\phi_2$, $\phi_3$ and $\phi_4$ are applied to gates 2c, 3c, 4c; 2d, 3d, 4d; 2e, 3e, 4e; and 2f, 3f, 4f, while phase $\phi_1$ is applied to 1d, 1e, and 1f. In this way, the charge is moved vertically downwardly to the multiplexer means 14 for readout.

For moving charge in the horizontal direction to the left, per FIGS. 9A-9E, phase $\phi_1$ is held in a highly repulsive state and applied to gates 1d, 1e, and 1f, thereby isolating the charge packets held in the columns. By clocking in the normal CCD fashion, phase $\phi_1'$ is applied to 1a, 1b, 1c, $d_2$ applied to 2a, 2b, 2c, $\phi_3$ applied to 3a, 3b, 3c, to move charge horizontally to the left.

The CCD clocking signals can be appended in series to implement any desired charge packet motion sequence. Of particular interest are sequences that permit charge packets to be manipulated so that all the charge packets in both columns and rows are moved "downward" without interchanging the charge packet order. Such a sequence is:

FIGS. 7A-7E, FIGS. 8A-8E, FIGS. 7A-7E, FIGS. 8A-8E, FIGS. 9A-9E, FIGS. 8A-8E, FIGS. 7A-7E, FIGS. 8A-8E, FIGS. 9A-9E, FIGS. 9A-9E

Timing sequences can be provided to perform a variety of operations useful for focal plane convolver operation.

The CCD roadway accumulates the convolutions for every image line simultaneously. The charge holding packets from one pixel are clocked to move horizontally in the roadway to reach neighboring pixels in carrying out the desired convolution, while already processed convolutions are simultaneously read out using the vertical columns of the roadway. The difference in the positive and negative labeled charge packets will be taken using the on-chip electrometer 16 and processor 18.

The processing rate of the focal plane convolver of the present invention can be very fast with a differential electrometer used at each output column and clocked at 24 mHz to achieve a frame rate of up to $10^5$ convolution frames per second. In the video rate (slow) mode, 30 frames per second are outputted and a single differential electrometer is used for the entire image.

In performing convolutions for a 2×2 array neighborhood having coefficients $$\begin{bmatrix} -1 & -1 \\ +1 & +1 \end{bmatrix},$$

referring to FIG. 2, the charge packets will travel the roadway occasionally stopping to collect charge from neighboring pixels labeled (1,1), (1,2), (2,1) and (2,2).

Assuming charge is loaded into the negatively labeled charge holding packet 28a in the first instance, charge is accumulated at this pixel site for one unit of time, so that the convolution multiplier is $-1$. The charge packet 28a is then caused to move to the right horizontally to the pixel (1,2) with charge again added to negatively labeled charge packet 28a. The integration time is the same so that the convolution coefficient for pixel (1,2) is also $-1$. Had the integration time been different, say 2 units of time, then the coefficient would be $-2$. Thus, time multiplexing permits the convolution coefficients to be varied. The charge packet 28a is then caused to move down the column to the row below and then to the left to pixel (2,2). In keeping with the desired convolution, the positively labeled charge packet 28b is now used to collect the charge from pixel (2,2), which for an integration time of one unit to provide a convolution coefficient of $+1$. The charge packet 28b is then moved to the left over pixel (2,1) to collect charge accumulating for one unit of time. This charge is added to the positively labeled charge packet 28b which corresponds to a convolution coefficient of $+1$ for the (2,1) pixel site. The convolution is now completed and charge has been collected from two upper pixels with $-1$ convolution coefficients, and from two lower pixels with $+1$ convolution coefficients, when the difference between the charges is taken through the differential electrometer, the signal will be small if no spatial variation of intensity occurs in this neighborhood. However, for horizontal-like edges, this convolution will yield a large signal proportional to the y-derivative of the scene intensity.

In like manner, more complex convolutions can be performed on larger arrays, such as 7×7 arrays, using the CCD focal plane array convolver of the present invention.

I claim:

1. A semiconductor CCD focal plane array convolver which permits performing convolution functions on the focal plane array, and comprises:
   (a) an X-Y array of photosensitive pixels disposed in a semiconductive substrate;
   (b) a CCD roadway means comprising a pattern of rows and columns of conductive gates upon the substrate, which rows and columns of gates surround and define the X-Y array of pixels, with the gate configuration being selected to permit charge to be accumulated in a first charge holding packet defined for a positive convolution coefficient, and in a paired second charge holding packet for a negative convolution coefficient for each individual pixel;
   (c) means for applying clocked signals to the CCD gates associated with respective pixels to permit charge to be injected from respective pixels into the respective paired first and second charge holding packets, with the accumulated charge in any charge holding packet being determined by the integrated input radiation period and image intensity at the respective pixel; and for moving the charge holding packets along the CCD roadway to accumulate charge from a predetermined subarray of neighboring pixels to implement a predetermined linear convolution, and for moving the charge stored in paired charge holding packets accumulated from already processed convolutions along the CCD roadway to the periphery of the CCD roadway;
   (d) means on the semiconductive substrate at the CCD roadway periphery for differencing the accumulated charge stored in paired charge holding packets to difference the positive and negative convolution contributions to provide a convolution output signal.

2. The semiconductor CCD focal plane array convolver set forth in claim 1, wherein each intersection of the CCD roadway comprises a coupling gate coupled to two Y branches with one arm of the Y being part of a column and the other arm being part of a row of the roadway which permit charge packets to move in any one of four independent paths along the CCD roadway.

3. The semiconductor CCD focal plane array convolver set forth in claim 1, wherein the CCD roadway uniquely associated with an individual pixel contains five charge holding packet regions.

4. The semiconductor CCD focal plane array convolver set forth in claim 1, wherein four of the charge holding packet regions consist of four gates for each charge holding packet region consists of five gates.

* * * * *